United States Patent [19]

Buck et al.

[11] Patent Number: 5,017,895
[45] Date of Patent: May 21, 1991

[54] MAGNETOSTATIC WAVE (MSW) FILTER WITH SHARP UPPER CUT-OFF FREQUENCY AND CHANNELIZER FORMED THEREFROM

[75] Inventors: Daniel C. Buck, Hanover; Steven N. Stitzer, Ellicott City, both of Md.

[73] Assignee: Westinghouse Electric Corp., Pittsburgh, Pa.

[21] Appl. No.: 405,714

[22] Filed: Sep. 11, 1989

[51] Int. Cl.$^5$ .................... H01P 1/213; H01P 1/215
[52] U.S. Cl. ......................................... 333/134; 333/202
[58] Field of Search .................. 333/219, 219.2, 202, 333/201, 186, 141, 193, 147–149, 24.2, 134

[56] References Cited

U.S. PATENT DOCUMENTS

| 3,353,119 | 11/1967 | Honig et al. | 333/24.2 X |
| 4,395,686 | 7/1983 | Adam | 333/151 |
| 4,614,919 | 9/1986 | Floyd | 333/147 X |
| 4,845,439 | 7/1989 | Stitzer et al. | 333/24.2 X |

FOREIGN PATENT DOCUMENTS 143818  11/1980  Japan ................................. 333/202

OTHER PUBLICATIONS

Adam, Annual Frequency Control Symposium 1982; "Magnetostatic Wave Multi-Channel Filters".
Murakami et al., 1985 IEEE MTT-S Digest; (K4), pp. 285-288.
Adam, 1985 IEEE Ultrasonics Symposium, pp. 157-162.
Adam, IEEE Transactions on Magnetics, 1987, vol. MAG-23, No. 5, 9/1987, pp. 3742-3744.
Takeda, 1987 IEEE Transactions on Magnetics, pp. 3340-3342.
Murakami et al., 1987 IEEE MTT-S Digest, (J-33), pp. 371-374.
Adam et al., 1988 IEEE MTT-S Digest, (FF-4); pp. 879-882.

Primary Examiner—Eugene R. Laroche
Assistant Examiner—Benny Lee
Attorney, Agent, or Firm—John K. Williamson

[57] ABSTRACT

In the present invention the upper edge of the frequency response of the magnetostatic wave (MSW) filter is sharpened. A band limiting element (BLE) is coupled to the MSW filter, preferably in the filter element output. In one embodiment the BLE absorbs signals above a certain frequency in the upper band edge of the MSW. In another embodiment, the BLE reinforces the output response.

14 Claims, 5 Drawing Sheets

MAGNETOSTATIC WAVE (MSW) FILTER WITH SHARP UPPER CUT-OFF FREQUENCY AND CHANNELIZER FORMED THEREFROM

BACKGROUND OF THE INVENTION

1. Field of the Invention

The invention relates to magnetostatic wave (MSW) filters and, in particular, the invention relates to MSW having a relatively sharp upper cut-off frequency.

2. Description of Related Art

MSW filter elements exhibit sharp attenuation of the signal at the so called lower frequency cut-off and exhibit gradual attenuation at the upper frequency cut-off. Higher selectivity may be achieved when the upper cut-off frequency is sharpened. MSW filter banks and channelizers offer potential of high selectivity over multi-GHz bands with individual passbands in the range of 10-50 MHz, with relatively low loss and extremely small size. The individual passbands have well known shapes which are in general influenced by the MSW propagation physics and geometrical aspects of the filter construction.

The MSW filter 10 illustrated in FIG. 1 consists of a yttrium iron garnet (YIG) film 12 suspended over two current carrying transducers 14 and 16. The YIG film 12 is supported by and epitaxially grown on a gadolinium gallium garnet (GGG) substrate 18. An alumina substrate 20 supports the input and output transducers 14 and 16. A static or DC magnetic field $H_{DC}$ in combination with the geometry of the MSW 10 sets the passband of the filter 10.

In FIG. 2 a curve 19 of transmission loss (db) V. frequency represents the passband of the MSW filter 10 of FIG. 1. The sharp lower edge 24 is due to the fact that MSWs travelling in the X direction (FIG. 1) have a lower cut-off frequency at which all of the spin moments in the system precess or rotate at the gyromagnetic frequency $f_o = \gamma H$ where H is the applied field and $\gamma$ is the gyromagnetic ratio 2.8 MHz/oersted.

The gradual or sloped upper band edge 26 of the passband 19 is determined by several factors, including the fact that when current distribution in the X direction 25 of the transducer 16 is fourier transformed, it determines one factor in the frequency response of the filter 10. The frequency response is also shaped by reflection of MSW from the end of the YIG film. If the YIG film 12 is spaced from the transducers 14-16, the higher sidelobes of the transform fade out, leaving a replica of the fundamental lobe, the slope of which depends on transducer current density. However, the technique does not always produce the desired attenuation. The gradual slope is generic to MSW filter elements.

SUMMARY OF THE INVENTION

In the present invention the upper edge of the frequency response of the magnetostatic wave (MSW) filter is sharpened. A band limiting element (BLE) is coupled to the MSW filter, preferably in the filter element output. In one embodiment the BLE absorbs signals above a certain frequency in the upper band edge of the MSW. In another embodiment, the BLE reinforces the output response.

In accordance with a preferred embodiment of the present invention the device includes a MSW filter formed of a first YIG element coupled to a pair of microstripline transducers. The BLE is a second YIG element with at least one bevelled edge for signal absorption operatively coupled to the MSW filter output. The BLE is tuned by the magnetic field to lie in the upper band edge of the MSW to thereby sharpen the upper frequency response thereof. Other embodiments of the present invention include a band sharpener and a multiple frequency channelizer.

DESCRIPTION OF THE PREFERRED EMBODIMENT

Figure 3:
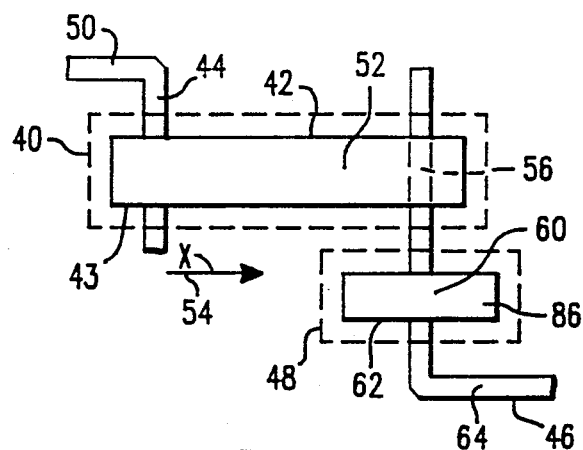
FIG. 3 is a schematic diagram of a MSW filter according to the present invention.
Figure 4:
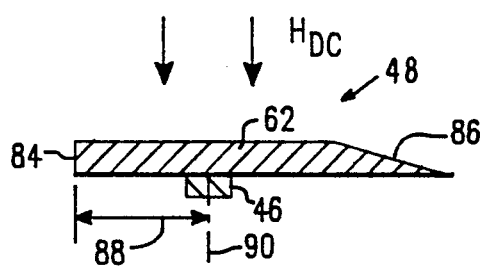
FIG. 4 is a side sectional view of the band limiting element which forms a portion of the MSW filter of FIG. 3.

A device 40 in accordance with the present invention is illustrated in FIGS. 3-4. The device 40 includes a magnetostatic wave (MSW) filter 42 formed of a YIG film on a substrate and an input transducer or microstripline 44, and output transducer or microstripline 46 and a band limiting element (BLE) 48 coupled to the MSW filter 42 via output stripline 46. The BLE 48 has a wedge-shape as illustrated in the cross-sectional view of FIG. 4.

A microwave input signal 50 is coupled to the input stripline 44 as shown. The input signal 50 is coupled to the YIG film 42 where it is converted to a magnetostatic wave 52 which travels down the YIG film 42 in the X or propagation direction 54 of the film. At the output 46, the magnetostatic wave 52 is converted to a RF filter output 56 in the form of microwave conduction current in output stripline 64. Those frequency components in the input signal 50 above a predetermined frequency near the top of the high band edge of the MSW filter 42 are reconverted to magnetostatic waves 60 in the BLE 48 which comprises a YIG film 62. BLE waves 60 are thereafter converted to heat in the tapered end of the YIG film 62.

Figure 1:
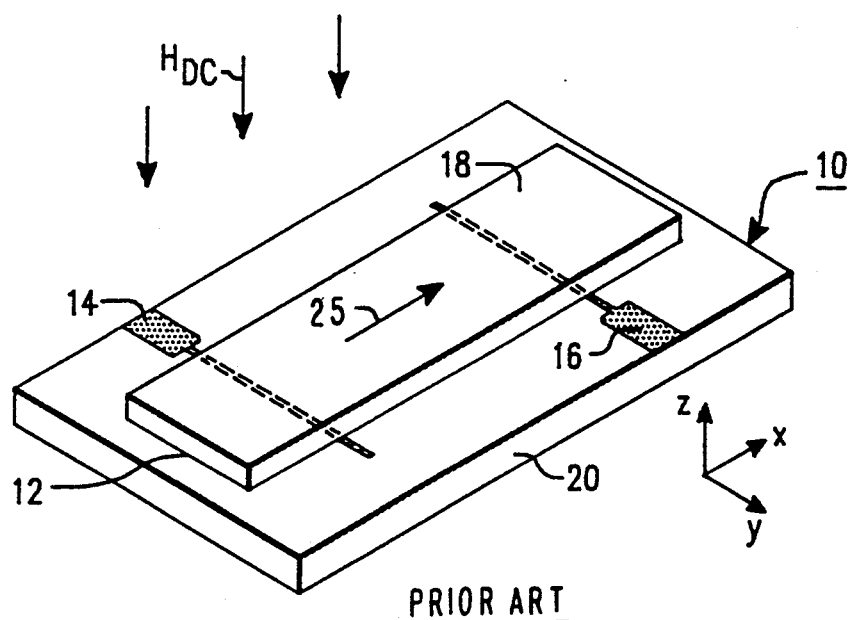
FIG. 1 is a schematic diagram of a known MSW filter.
Figure 2:
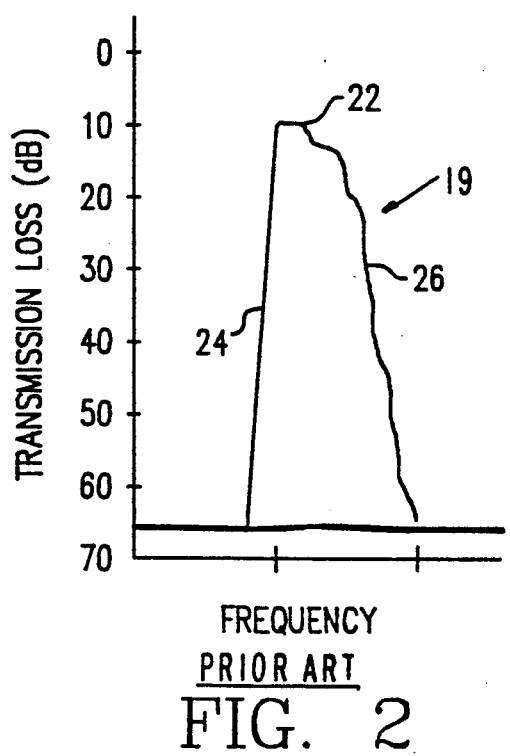
FIG. 2 is a plot of the frequency response of the MSW filter of FIG. 1.
Figure 5:
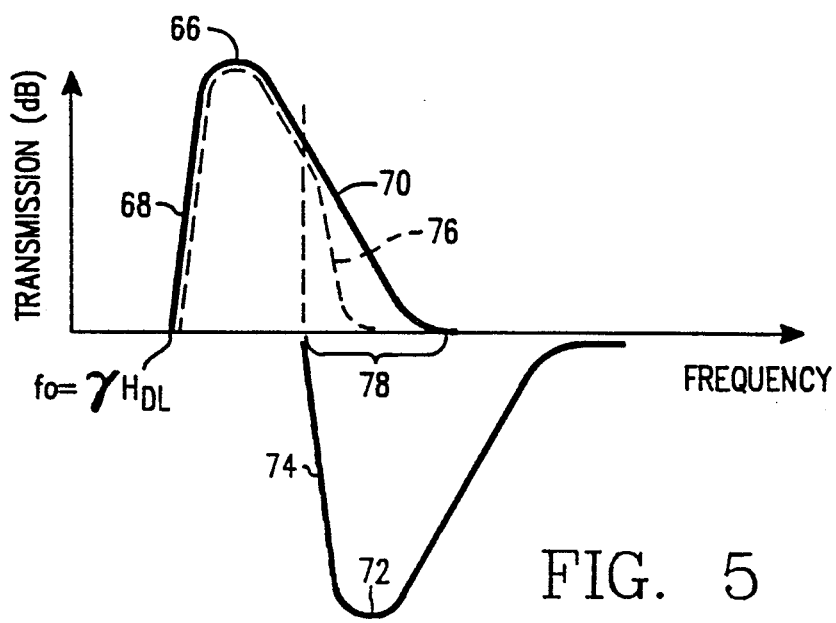
FIG. 5 is a plot of the frequency response of the MSW filter of FIGS. 3 and 4.

The various frequency responses of the device 40, MSW filter 42 and BLE 48 are illustrated in FIG. 5 as follows. The frequency response of the filter 42 is a positively going solid line curve 66 (similar to curve 22 in FIG. 2) having a relatively sharp lower cut-off frequency 68 and a gradual upper cut-off frequency response 70. The frequency response of the BLE 48 is illustrated by the negative going solid line curve 72 in FIG. 5. The configuration of the YIG film 62 forming the band limiting element 48 is such that it absorbs energy in the frequency range illustrated. Accordingly, the curve 72, as shown, is a negative going response curve. The lower cut-off frequency 74 of the BLE response 72 is sharp and overlaps the upper cut-off frequency response 70 of MSW filter 42 in the region 78 as shown. The combination of the frequency responses of the MSW filter 42 and the band limiting element 48, namely respective curves 66, 72, is illustrated in FIG. 5 by the dotted curve 76 which illustrates the sharpened cut-off frequency response of the device 40.

The wedge shape of BLE 48 facilitates absorption of the BLE magnetostatic wave 60 in the YIG film 62. In accordance with the present invention, at least one end 84 of the YIG film 62 is square and the other end 86 is tapered (FIG. 4). The configuration of the YIG film 62 and the output stripline 46 is such that the distance 88 between the centerline 90 of the stripline 46 and the square or sharp edge 84 of the film 62 and the bias field $H_{DC}$ establishes the sharp lower cut-off frequency 74 of the response 72 in FIG. 4. The tapered end 86 of the film 62 absorbs most of the high frequency components of the magnetostatic wave 60 propagating in the film 62. Thus, unwanted high order signals are eliminated or greatly reduced.

Figure 6:
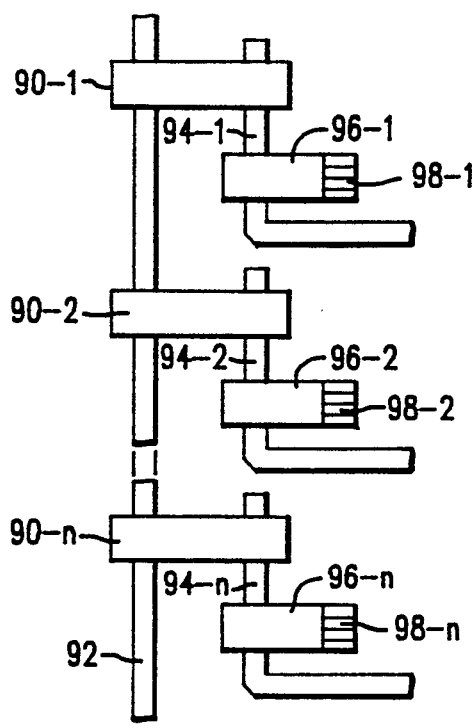
FIG. 6 is a schematic diagram of a multiple output MSW channelizer according to the present invention.

Another embodiment of the present invention is a multiband channelizer 90 illustrated in FIG. 6 in which a multiplicity MSW filter elements 90-1 ... 90-n are arranged along a microstrip input manifold 92. Each YIG element 90-1 ... 90-n has a corresponding microstrip output element 94-1 ... 94-n and a respective YIG band limiting element 96-1 ... 96-n. Each BLE 96-1 ... 96-n has a tapered end 98-1 ... 98-n for absorbing the corresponding high frequency components.

Figure 7:
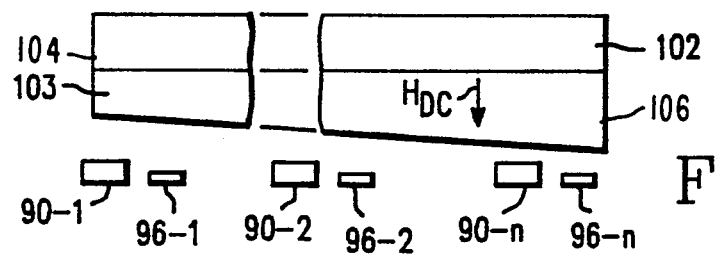
FIG. 7 is a side sectional view of the MSW channelizer of FIG. 6.

Each filter element 90-1 ... 90-n is tuned by the DC bias $H_{DC}$ to a selected band and each corresponding BLE 96-1 ... 96-n is tuned to the upper edge of the band for the corresponding MSW. Tuning of each of the band limiting elements 96-1 ... 96-n is accomplished by varying the bias field for each filter and BLE. The static magnetic field $H_{DC}$ increases with increasing frequency response. For example, FIG. 7 illustrates in schematic side section the individual MSW channelizers 90-1 ... 90-n and the corresponding band limiting elements 96-1 ... 96-n. A magnet 102 and tapered pole piece 103 establish the distribution of the field $H_{DC}$. The DC magnetic field $H_{DC}$ varies with the increasing thickness of the magnet 102 from the relatively narrow end 104 to the relatively thick end 106, as shown.

Figure 8:
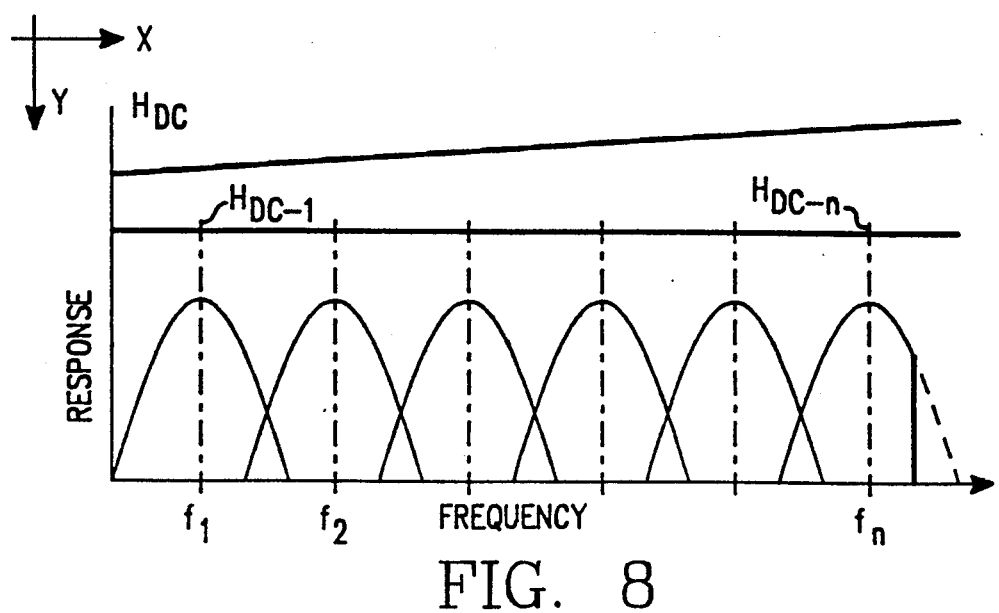
FIG. 8 is a plot frequency response of the channelizer of FIGS. 6 and 7 showing $H_{DC}$ field variation.

The frequency response and the corresponding $H_{DC}$ field variation of the channelizer 90 of FIGS. 6-7 is shown in FIG. 8. Each filter 90-1 ... 90-n is centered in a respective corresponding band $f_1$-$f_n$. In accordance with the corresponding average DC bias field $H_{DC}$-1 ... $H_{DC}$-n.

Figure 9A:
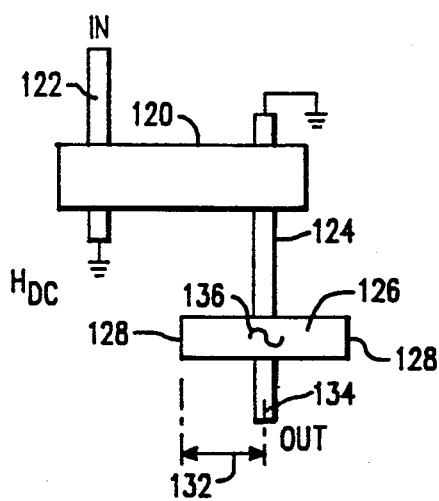
FIGS. 9A-9D illustrate alternative embodiments of MSW filters of the present invention including one equivalent circuit.

The above described embodiments of the present invention feature the use of a lossy MSW termination or band limiting element (BLE) at the output of a MSW filter. In accordance with another embodiment of the present invention, a BLE comprising a reactive MSW resonator or stub may be located in operative relationship with the output transducer in order to reflect the undesired energy back into the circuit. FIG. 9A illustrates such an arrangement in which the YIG, MSW filter element 120 carries RF energy from the input 122 to the output 124. A YIG, BLE element 126 with square cut ends 128 may be located in operative relationship with the output strip 124. In accordance with the invention, each square cut end 128 of the YIG element 126 acts like an open circuited quarter wave stub. In other words, the distance 132 between the centerline 134 of the microstrip 124 and each square edge 128 of the YIG film 126 is a quarter wave length of the MSW signal 136 carried by the YIG element 126. Because the propagation loss in the YIG film 126 is low, and due to the high reflection from each square edge 128, the Q or resonance of the system is high.

Figure 10A:
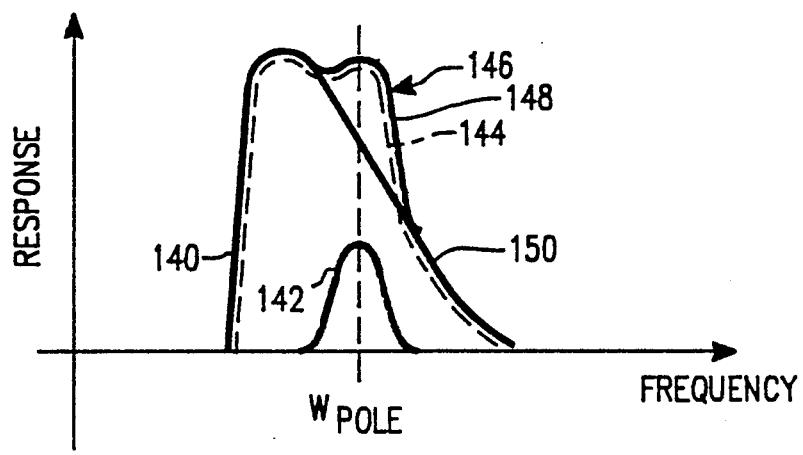
FIGS. 10A-10B are plots of the frequency response of selected embodiments of FIGS. 9A-9D.

The arrangement illustrated in FIG. 9A featuring the square edge 128 at opposite ends of the film 126 has the effect of producing a peak in the filter pass band as illustrated in FIG. 10A. The waveform 140 in solid line represents the frequency response of the YIG element 120 and the waveform 142 represents the frequency response of the stub 126. The resulting frequency response of the system corresponding to the sum of the responses 140 and 142, is illustrated by the dotted line 144. The peak 146, in effect, produces a high frequency cut-off 148 which is sharper than the cut-off 150 of curve 140 alone. Also further refinement of the frequency response can be achieved by varying the magnetic coupling between the film 126 and the output stripline 124 by adjusting the spacing (i.e. gap) between the elements.

Figure 9B:
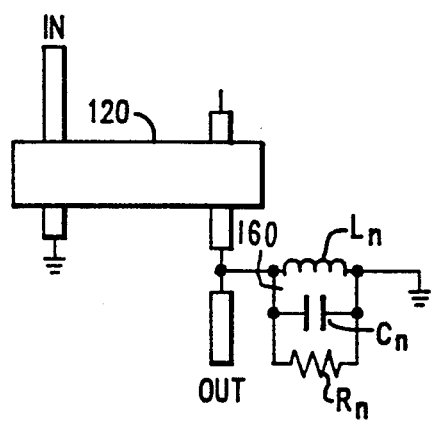
Figure 9C:
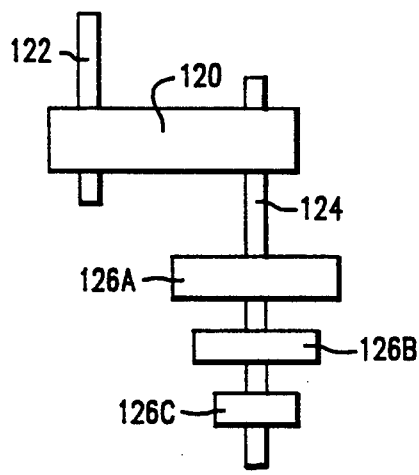

An equivalent circuit for the arrangement of FIG. 9A is illustrated in FIG. 9B in which the RLC reactive circuit 160 including resistor $R_n$, capacitor $C_n$ and inductor $L_n$; represents a high frequency reactive impedance YIG strip 126 at the output of the MSW 120. The frequency of the pole, namely $1/LC$ of the reactive circuit 160 is determined by the length of the stub 126 (FIG. 9A) and the applied magnetic field $H_{DC}$. As noted, the coupling or resistive component can be adjusted by varying the spacing between the film 126 and the output microstrip transducer 124. A plurality of YIG stubs 126A–126C may be provided for further shaping the frequency response of the device (FIG. 9C).

Figure 9D:
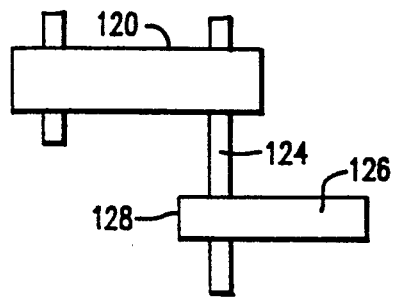
Figure 10B:
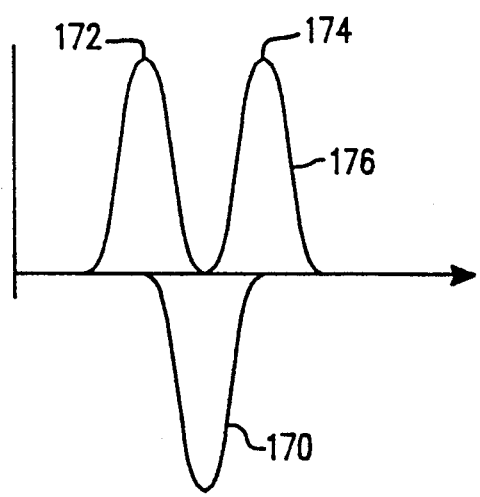

Further, if desired the YIG stub 126 may be located off center at quarter wave distances to the ends 128 over the transducer 124 (FIG. 9D). The response 176 shown in FIG. 10B would produce two peaks 172, 174 in the output signal 176 at different frequencies, providing further frequency control and refinement possibilities. The curve 170 represents the reflection from one edge of the stub. Curve 176 represents the sum of the reflections from the other edge and the first mentioned reflection represented by curve 170.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An apparatus for modifying microwave signals above a preselected frequency comprising:
   at least one magnetostatic wave (MSW) filter element, each MSW filter element having an input for receiving microwave signals and being responsive to produce magnetostatic waves (MSWs) for propagation therein, and an output, said MSW filter element being tuned to a first selected band of frequencies and having an output characteristic in which the frequencies are gradually reduced above the band; and at least one upper band limiting element being associated with and operatively coupled to the output of a corresponding MSW filter for receiving and carrying the MSWs therein, said BLE being tuned to a second band of frequencies near an upper end of the first band for absorbing selected upper frequencies in said first band to modify the output characteristic of each MSW filter element so that the output of the MSW above said first selected band of frequencies is sharply reduced compared to the output characteristic of the MSW without the BLE.

2. The apparatus of claim 1 wherein said MSW includes a ferrite member and a pair of spaced striplines thereon one stripline being located at the input of the MSW and one stripline being located at the output of the MSW.

3. The apparatus of claim 2 wherein the BLE includes a tapered ferrite member coupled to the stripline at the output of the MSW.

4. The apparatus of claim 3 wherein the tapered ferrite has an edge operative for reflecting lower frequency components of the MSW towards the stripline and a tapered end for absorbing higher frequency components of the MSW therein.

5. The apparatus of claim 4 wherein the edge of the tapered ferrite is located such that the BLE has a resulting sharp frequency response for overlapping the high frequency response of the filter.

6. The apparatus of claim 1 wherein each magnetostatic wave filter element carries MSWs in a direction of propagation from the input to the output and is tuned by a DC magnetic field normal to the direction of propagation of magnetostatic waves carried thereby.

7. The apparatus of claim 6 in which the DC field for each MSW filter element increases in a direction perpendicular to the propagation direction of the MSW.

8. The apparatus of claim 7 further comprising a tapered magnet having a thickness increasing in the direction perpendicular to the propagation of the MSW for increasing the frequency response of each filter.

9. The apparatus of claim 2 wherein the BLE includes a ferrite member having edges spaced one-quarter wave length of the MSW from the stripline at the output of the MSW for reflecting energy therein.

10. The apparatus of claim 9 wherein the ferrite associated with the BLE provides equivalent inductive, capacitive and resistive reactance tuned to the upper end of the first band for increasing the response thereof to thereby sharpen the cut-off frequency of the output.

11. An apparatus for modifying microwave signals above a preselected frequency comprising:

a plurality of magnetostatic wave (MSW) filter elements, each MSW filter element having an input for receiving microwave signals and being responsive to produce magnetostatic waves (MSWs) for propagation therein, and an output, said MSW filter element being tuned to a corresponding first selected band of frequencies and having an output characteristic in which the frequencies are gradually reduced above the band;

an input transducer commonly coupled to the inputs of the MSW filter elements and an output transducer for each MSW filter element output; and a plurality of upper bank limiting elements (BLE), at least one BLE being associated with and operatively coupled to the output transducer of each corresponding MSW filter element for receiving and carrying the MSWs therein, each corresponding BLE being tuned to a second band of frequencies near an upper end of the corresponding first band for absorbing selected frequencies in said first band to modify the output characteristic of each MSW filter element, so that the output of said MSW filter element above its corresponding first band of frequencies is sharply reduced compared to the output characteristic of such MSW without the corresponding BLE.

12. An apparatus for modifying microwave signals in a preselected frequency passed thereto comprising:

at least one magnetostatic wave (MSW) filter element, each MSW filter element having an input for receiving microwave signals and being responsive to produce MSWs for propagation therein and an output, said MSW filter element being tuned to a first selected band of frequencies and having a characteristic first frequency response;

at least one band limiting element (BLE) operatively coupled to the output corresponding MSW filter elements for receiving the MSWs, said BLE being tuned to a second band of frequencies overlapping at least a portion of the first band and having a characteristic second frequency response for selectively increasing or decreasing the first frequency response of the MSW filter in said second band of frequencies, each BLE including means for constructively or destructively enhancing the output of the MSW filter element.

13. The apparatus of claim 12 wherein the BLE comprises a MSW absorber.

14. The apparatus of claim 12 wherein the BLE comprises a MSW reactive element.

* * * * *